(12) United States Patent
Choi et al.

(10) Patent No.: US 12,317,732 B2
(45) Date of Patent: May 27, 2025

(54) ORGANIC PHOTODETECTOR AND ELECTRONIC DEVICE INCLUDING THE SAME

(71) Applicant: Samsung Display Co., Ltd., Yongin-si (KR)

(72) Inventors: Minsoo Choi, Yongin-si (KR); Seokgyu Yoon, Yongin-si (KR); Jinsoo Jung, Yongin-si (KR); Youngeun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 447 days.

(21) Appl. No.: 17/752,780

(22) Filed: May 24, 2022

(65) Prior Publication Data

US 2023/0014108 A1  Jan. 19, 2023

(30) Foreign Application Priority Data

Jul. 13, 2021 (KR) .................. 10-2021-0091685

(51) Int. Cl.
| | |
|---|---|
| *H10K 65/00* | (2023.01) |
| *H10K 30/81* | (2023.01) |
| *H10K 85/30* | (2023.01) |
| *H10K 30/20* | (2023.01) |
| *H10K 85/20* | (2023.01) |

(52) U.S. Cl.
CPC ............ *H10K 65/00* (2023.02); *H10K 30/81* (2023.02); *H10K 85/311* (2023.02); *H10K 85/371* (2023.02); *H10K 30/20* (2023.02); *H10K 85/211* (2023.02)

(58) Field of Classification Search
None
See application file for complete search history.

(56) References Cited

U.S. PATENT DOCUMENTS

| | | | |
|---|---|---|---|
| 8,933,868 B2 | 1/2015 | Choi | |
| 9,142,789 B2 | 9/2015 | Benwadih | |
| 10,727,285 B2 | 7/2020 | Chung et al. | |
| 2016/0285034 A1* | 9/2016 | Lee | H10K 59/12 |
| 2022/0285461 A1* | 9/2022 | Hatsumi | H10K 59/40 |
| 2022/0293683 A1* | 9/2022 | Kang | H10K 59/12 |

FOREIGN PATENT DOCUMENTS

| | | |
|---|---|---|
| KR | 10-1333783 | 11/2013 |
| KR | 10-2019-0004678 | 1/2019 |
| KR | 10-2039007 | 10/2019 |

* cited by examiner

*Primary Examiner* — Anthony Ho
(74) *Attorney, Agent, or Firm* — KILE PARK REED & HOUTTEMAN PLLC

(57) ABSTRACT

An organic photodetector including: a substrate; a first electrode arranged on the substrate; a second electrode arranged on the substrate and apart from the first electrode in a first direction crossing a direction perpendicular to the substrate; and an active layer covering the first electrode and the second electrode.

20 Claims, 12 Drawing Sheets

ORGANIC PHOTODETECTOR AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0091685, filed on Jul. 13, 2021, in the Korean Intellectual Property Office, the disclosure of which is incorporated by reference herein in its entirety.

BACKGROUND

Field

One or more embodiments relate to organic photodetectors and electronic devices including the same.

Discussion of the Background

Optoelectronic devices, as devices for converting light and electrical signals, may include photodiodes, phototransistors, and the like, and may be applied to image sensors, solar cells, organic light-emitting elements, and the like.

In the case of silicon, which is mainly used for photodiodes, as a pixel size decreases, an absorption area decreases as well, and thus sensitivity may decrease. Accordingly, organic materials that are able to replace silicon have been researched.

As organic materials have a large light absorption coefficient and may optionally absorb light in a specific wavelength range depending on the molecular structure, organic materials may simultaneously replace a photodiode and a color filter, which is very advantageous for sensitivity improvement and high integration.

An organic photodetector (OPD) containing such an organic material may be applied to, for example, display devices and image sensors.

SUMMARY

One or more embodiments include organic photodetectors with improved photodetection efficiency, and an electronic device including the same.

Additional aspects will be set forth in part in the description which follows and, in part, will be apparent from the description, or may be learned by practice of the presented embodiments of the disclosure.

According to an aspect of the disclosure, an organic photodetector includes a substrate, a first electrode arranged on the substrate, a second electrode arranged on the substrate and apart from the first electrode in a first direction crossing a direction perpendicular to the substrate, and an active layer covering the first electrode and the second electrode.

In an embodiment, the first electrode and the second electrode may be arranged on the same layer.

In an embodiment, the active layer may include a p-type semiconductor layer including a p-type organic semiconductor and an n-type semiconductor layer including an n-type organic semiconductor.

In an embodiment, the active layer may be a mixed layer of the p-type organic semiconductor and the n-type organic semiconductor.

In an embodiment, the p-type organic semiconductor may include SubPc, CuPc, DBP, or any combination thereof, and the n-type organic semiconductor may include C60 fullerene, C70 fullerene, or any combination thereof.

In an embodiment, the organic photodetector may further include a third electrode arranged on the substrate, and an insulating layer covering the third electrode.

In an embodiment, the insulating layer may cover an upper surface and a side surface of the third electrode.

In an embodiment, the active layer may cover the insulating layer.

In an embodiment, the third electrode may be arranged on the same layer as the first electrode and the second electrode.

According to another aspect of the disclosure, an electronic device includes a substrate, an organic photodetector including a first electrode arranged on the substrate, a second electrode arranged on the substrate and apart from the first electrode in a first direction crossing a direction perpendicular to the substrate, and an active layer covering the first electrode and the second electrode, and a light-emitting element including a pixel electrode arranged on the substrate, a counter electrode arranged on the pixel electrode, and a light-emitting layer arranged between the pixel electrode and the counter electrode.

In an embodiment, the first electrode and the second electrode may be arranged on the same layer.

In an embodiment, the active layer may include a p-type semiconductor layer including a p-type organic semiconductor and an n-type semiconductor layer including an n-type organic semiconductor.

In an embodiment, the active layer may be a mixed layer of the p-type organic semiconductor and the n-type organic semiconductor.

In an embodiment, the electronic device may further include a third electrode arranged on the substrate, and an insulating layer covering the third electrode.

In an embodiment, the third electrode may be arranged on the same layer as the first electrode and the second electrode.

In an embodiment, the pixel electrode may be arranged on the same layer as the first electrode.

In an embodiment, the light-emitting element may include a first common layer arranged between the pixel electrode and the light-emitting layer and a second common layer arranged between the light-emitting layer and the counter electrode.

In an embodiment, the substrate may include a light-emitting area and a sensing area, the light-emitting element may be arranged to correspond to the light-emitting area, and the organic photodetector may be arranged to correspond to the sensing area.

In an embodiment, the pixel electrode and the light-emitting layer may be arranged to correspond to the light-emitting area.

In an embodiment, the first common layer and the second common layer may be arranged entirely in the light-emitting area and the sensing area.

Other aspects, features, and advantages than those described above will become apparent from the following drawings, claims, and detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
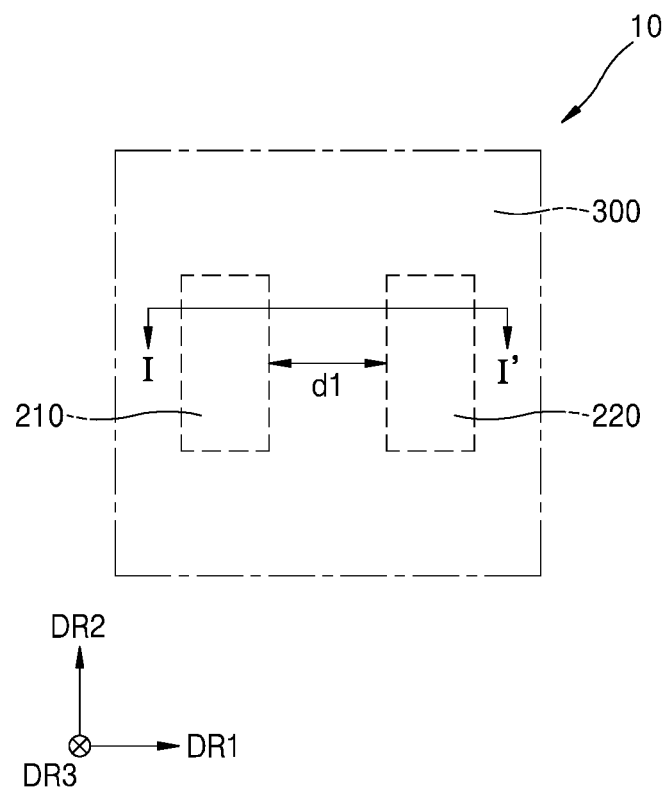
FIG. 1 is a schematic plan view of an organic photodetector according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

It will be understood that although the terms "first," "second," etc. may be used herein to describe various components, these components should not be limited by these terms. These components are only used to distinguish one component from another.

As used herein, the singular forms are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. For example, since sizes and thicknesses of components in the drawings are arbitrarily illustrated for convenience of explanation, the following embodiments are not limited thereto.

In the specification, the expression such as "A and/or B" may include A, B, or A and B. Furthermore, the expression such as "at least one of A and B" may include A, B, or A and B.

In an embodiment below, the meaning that the wiring "extends in the first direction or the second direction" includes not only extending in a linear shape, but also extending in a zigzag or a curve along the first direction or the second direction.

In embodiments below, when referred to as "on a plane," this means when an object part is viewed from above, and when it is referred to as "in a cross-section," it means when the cross-section where the object part is cut vertically is viewed from the side. In embodiments below, when referred to as "overlapping," it includes overlapping "on a plane" and "in a cross-section."

Hereinafter, exemplary embodiments will be described in detail with reference to the accompanying drawings, and in the description with reference to the drawings, the same or corresponding constituents are indicated by the same reference numerals and redundant descriptions thereof are omitted.

Figure 2:
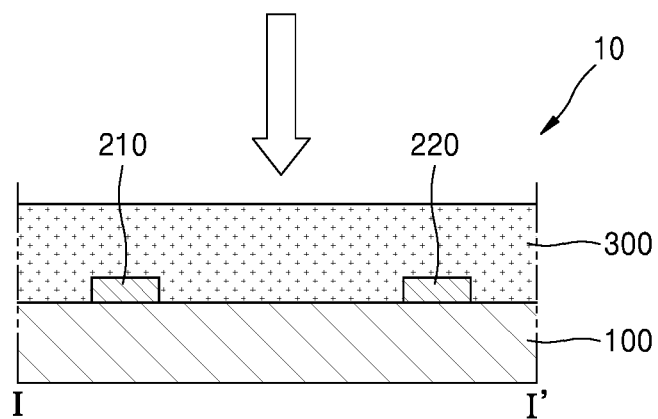
FIG. 2 is a schematic cross-sectional view of an organic photodetector according to an embodiment.
Figure 2:
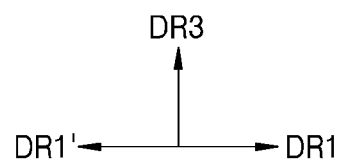

FIG. 1 is a schematic plan view of an organic photodetector 10 according to an embodiment. FIG. 2 is a schematic cross-sectional view of the organic photodetector 10 of FIG. 1. FIG. 2 is a cross-sectional view of the organic photodetector 10 taken along line I-I' of FIG. 1.

Referring to FIGS. 1 and 2, the organic photodetector 10 according to the present embodiment may include a substrate 100, a first electrode 210, a second electrode 220, and an active layer 300. In an embodiment, the first electrode 210 and the second electrode 220 may be arranged on the substrate 100, and the first electrode 210 and the second electrode 220 may be apart from each other in a first direction DR1 crossing a direction DR3 that is perpendicular to the substrate 100.

In an embodiment, the substrate 100 may include glass or polymer resin. For example, when the substrate 100 includes polymer resin, the substrate 100 may include any one of polyimide, polyethylene naphthalate, polyethylene terephthalate, polyarylate, polycarbonate, polyetherimide, and polyethersulfone.

In an embodiment, the first electrode 210 and the second electrode 220 may be arranged on the substrate 100. For example, the first electrode 210 and the second electrode 220 may be provided on the same layer and may include the same material. The first electrode 210 and the second electrode 220 may each include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 210 and the second electrode 220 may each include a reflective film including silver (Ag), magnesium (Mg), aluminum (Al), platinum (Pt), palladium (Pd), gold (Au), nickel (Ni), neodymium (Nd), iridium (Ir), chromium (Cr), or compounds thereof. In an embodiment, the first electrode 210 and the second electrode 220 may each further include a film including ITO, IZO, ZnO, or $In_2O_3$ above/below the above-described reflective film. For example, the first electrode 210 and the second electrode 220 may each have a multilayer structure of ITO/Ag/ITO.

In an embodiment, the first electrode 210 and the second electrode 220 may be apart from each other in the first direction DR1 crossing the direction DR3 that is perpendicular to the substrate 100. In an embodiment, the first electrode 210 and the second electrode 220 may be apart from each other in the first direction DR1 by a first distance dl. For example, the first distance dl may be 1 µm to 10 µm. When the separation distance (e.g., the first distance dl) in the first direction DR1 between the first electrode 210 and the second electrode 220 is less than 1 µm, a distance between the first electrode 210 and the second electrode 220 is too close so that noise of the organic photodetector 10 may be increased. In contrast, when the separation distance (e.g., the first distance dl) in the first direction DR1 between the first electrode 210 and the second electrode 220 exceeds 10 µm, the distance between the first electrode 210 and the second electrode 220 is too far so that photodetection efficiency may deteriorate. Accordingly, when the separation distance dl in the first direction DR1 between the first electrode 210 and the second electrode 220 is 1 µm to 10 µm, a signal to noise ratio (SNR) of the organic photodetector 10 may be increased, and simultaneously the photodetection efficiency may be improved.

In an embodiment, one of the first electrode 210 and the second electrode 220 may be an anode, and the other may be a cathode. For example, the first electrode 210 may be an anode, and the second electrode 220 may be a cathode. Alternatively, the first electrode 210 may be a cathode, and the second electrode 220 may be an anode.

In an embodiment, the active layer 300 may cover the first electrode 210 and the second electrode 220. For example, the active layer 300 may directly cover upper surfaces and side surfaces of the first electrode 210 and the second electrode 220.

In an embodiment, the active layer 300 may receive light from the outside to generate excitons and then separate the generated excitons into holes and electrons. The active layer 300 may include a p-type organic semiconductor and an n-type organic semiconductor. In this state, the p-type organic semiconductor may serve as an electron donor, and the n-type organic semiconductor may serve as an electron acceptor.

In an embodiment, the active layer 300 may be a mixed layer in which the p-type organic semiconductor and the n-type organic semiconductor are mixed. In this case, the active layer 300 may be formed by co-depositing the p-type organic semiconductor and the n-type organic semiconductor. When the active layer 300 is a mixed layer, as the excitons may be generated within a diffusion length from a donor-acceptor interface, the external quantum efficiency of the organic photodetector 10 may be improved.

In an embodiment, the p-type organic semiconductor may be a compound that serves as an electron donor for supplying electrons. For example, the p-type organic semiconductor may include boron subphthalocyanine chloride (SubPc), copper(II)phthalocyanine (CuPc), tetraphenyl dibenzoperiplantene (DBP), or any combination thereof, but the disclosure is not limited thereto.

In an embodiment, the n-type organic semiconductor may be a compound that serves as an electron acceptor for accepting electrons. For example, the n-type organic semiconductor may include C60 fullerene, C70 fullerene, or any combination thereof, but the disclosure is not limited thereto.

In an embodiment, when a (+) electric potential is applied to the first electrode 210, and a (−) electric potential is applied to the second electrode 220, the holes separated in the active layer 300 may move toward the second electrode 220, and the electrons separated in the active layer 300 may move toward the first electrode 210. Accordingly, a photocurrent may be formed in the direction DR1 from the first electrode 210 to the second electrode 220.

Furthermore, in an embodiment, when a (−) electric potential is applied to the first electrode 210, and a (+) electric potential is applied to the second electrode 220, the holes separated in the active layer 300 may move toward first electrode 210, and the electrons separated in the active layer 300 may move toward the second electrode 220. Accordingly, a photocurrent may be formed in a direction DR1' from the second electrode 220 to the first electrode 210.

When a bias is applied between the first electrode 210 and the second electrode 220, a dark current may flow in the organic photodetector 10. Furthermore, when light is incident on the organic photodetector 10, a photocurrent may flow in the organic photodetector 10. In an embodiment, the organic photodetector 10 may detect an amount of light from a ratio of the photocurrent and the dark current.

Figure 3:
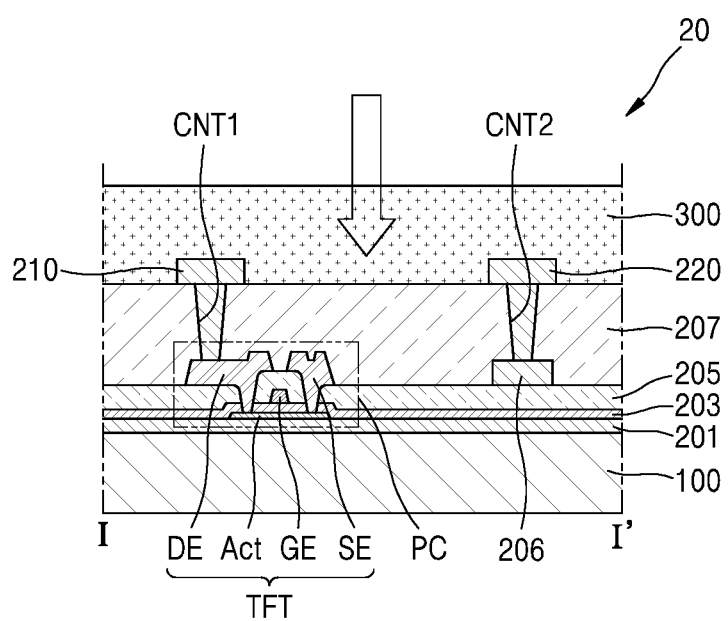
FIG. 3 is a schematic cross-sectional view of an organic photodetector according to an embodiment.
Figure 3:
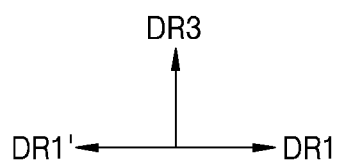

FIG. 3 is a schematic cross-sectional view of an organic photodetector 20 according to an embodiment. The embodiment of FIG. 3 differs from the embodiment of FIG. 2 in that the organic photodetector 20 further includes a thin film transistor TFT and a connection electrode 206 between the substrate 100 and the active layer 300. In FIG. 3, the same reference numerals as those in FIG. 2 denote the same constituent elements, and redundant descriptions thereof are omitted.

Referring to FIG. 3, the organic photodetector 20 may include the substrate 100, the thin film transistor TFT, the connection electrode 206, the first electrode 210, the second electrode 220, and the active layer 300.

In an embodiment, a buffer layer 201 may be arranged on the substrate 100. The buffer layer 201 may reduce or prevent the infiltration of foreign materials, moisture or external air from under the substrate 100. The buffer layer 201 may include an inorganic material such as silicon oxide, silicon oxynitride, silicon nitride, or silicon nitride, and may be a single layer or multilayer including the above-described material.

The thin film transistor TFT may be arranged on the buffer layer 201. The thin film transistor TFT may include a semiconductor layer Act, a gate electrode GE, a source electrode SE, and a drain electrode DE. Although FIG. 3 illustrates a top gate type in which the gate electrode GE is arranged on the semiconductor layer Act with a gate insulating layer 203 therebetween, the disclosure is not limited thereto. For example, the thin film transistor TFT may be of a bottom gate type.

The semiconductor layer Act may be located on the buffer layer 201. The semiconductor layer Act may include a channel region, and a source region and a drain region that are doped with impurities and arranged at both sides of the channel region. In this state, the impurities may include N-type impurities or P-type impurities. The semiconductor layer Act may include amorphous silicon or poly silicon. In an embodiment, the semiconductor layer Act may include an oxide of at least one or more materials selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). Furthermore, the semiconductor layer Act may include Zn oxide, In—Zn oxide, Ga—In—Zn oxide, and the like, as a Zn oxide-based material. Furthermore, the semiconductor layer Act may be an In—Ga—Zn—O (IGZO), In—Sn—Zn—O (ITZO), or In—Ga—Sn—Zn—O (IGTZO) semiconductor, that is, ZnO containing a metal such as indium (In), gallium (Ga), or stannum (Sn).

The gate electrode GE may be arranged on the semiconductor layer Act to at least partially overlap the semiconductor layer Act. In detail, the gate electrode GE may overlap the channel region of the semiconductor layer Act. The gate electrode GE may include various conductive materials including molybdenum (Mo), aluminum (Al), copper (Cu), titanium (Ti), and the like, and may have various layer structures. For example, the gate electrode GE may include a Mo layer and an Al layer, or have a multilayer structure of a Mo layer/an Al layer/a Mo layer. Furthermore, the gate electrode GE may have a multilayer structure including an ITO layer covering a metal material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, hafnium oxide, and the like. The gate insulating layer 203 may be a single layer or multilayer including the above-described material.

The source electrode SE and the drain electrode DE may be respectively connected to the source region and the drain region of the semiconductor layer Act through a contact hole. The source electrode SE and the drain electrode DE may include various conductive materials including Mo, Al, Cu, Ti, and the like, and have various layer structures. For example, the source electrode SE and the drain electrode DE may each include a Ti layer and an Al layer, and have a multilayer structure of a Ti layer/an Al layer/a Ti layer. Furthermore, the source electrode SE and the drain electrode DE may each have a multilayer structure including an ITO layer covering the metal material.

An interlayer insulating layer 205 may include an inorganic insulating material such as silicon oxide, silicon nitride, silicon oxynitride, aluminum oxide, titanium oxide, tantalum oxide, hafnium oxide, and the like. Furthermore, the interlayer insulating layer 205 may be a single layer or multilayer including the above-described material.

As such, the gate insulating layer 203 and the interlayer insulating layer 205 each including an inorganic material may be formed by a method such as chemical vapor deposition (CVD), atomic layer deposition (ALD), and the like, but the disclosure is not limited thereto.

The thin film transistor TFT may be covered by an organic insulating layer 207. For example, the organic insulating layer 207 may cover the source electrode SE and the drain electrode DE. The organic insulating layer 207, as a planarization insulating layer, may have an upper surface that is approximately flat. The organic insulating layer 207 may include an organic insulating material such as general purpose polymers such as polymethylmethacrylate (PMMA) or polystyrene (PS), polymer derivatives having a phenolic group, acrylic polymers, imide-based polymers, arylether-based polymers, amide-based polymers, fluorine-based polymers, p-xylene-based polymers, vinyl alcohol-based polymers, blends thereof, and the like. In an embodiment, the organic insulating layer 207 may include polyimide.

In an embodiment, the first electrode 210 and the second electrode 220 may be arranged on the organic insulating layer 207. Furthermore, the active layer 300 may be arranged on the organic insulating layer 207. The active layer 300 may cover the first electrode 210 and the second electrode 220, and may be arranged on the organic insulating layer 207.

In an embodiment, the first electrode 210 may be electrically connected to the drain electrode DE through a first contact hole CNT1 defined in the organic insulating layer 207. However, the disclosure is not limited thereto. The first electrode 210 may be electrically connected to the source electrode SE.

Furthermore, in an embodiment, the connection electrode 206 may be arranged on the interlayer insulating layer 205. The second electrode 220 may be electrically connected to the connection electrode 206 through a second contact hole CNT2 defined in the organic insulating layer 207. The second electrode 220 may receive a voltage through the connection electrode 206. The connection electrode 206 may include the same material as the source electrode SE and the drain electrode DE.

Although FIG. 3 illustrates that the first electrode 210 is electrically connected to the thin film transistor TFT and the second electrode 220 is electrically connected to the connection electrode 206, this is merely exemplary, and the disclosure is not limited thereto. For example, the first electrode 210 may be electrically connected to the connection electrode 206, and the second electrode 220 may be electrically connected to the thin film transistor TFT. Alternatively, the first electrode 210 and the second electrode 220 may be electrically connected to the thin film transistors TFT that are different from each other.

Furthermore, the connection electrode 206 may be arranged on the buffer layer 201, not the interlayer insulating layer 205, or may be arranged on the gate insulating layer 203.

Figure 4:
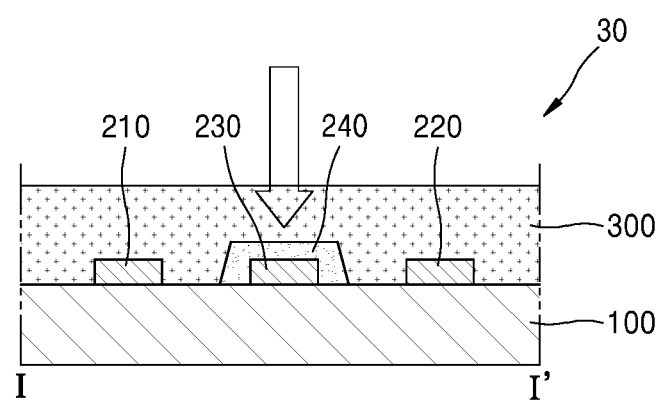
FIG. 4 is a schematic cross-sectional view of an organic photodetector according to an embodiment.
Figure 4:
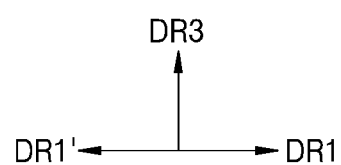

FIG. 4 is a schematic cross-sectional view of an organic photodetector 30 according to an embodiment. The embodiment of FIG. 4 differs from the embodiment of FIG. 2 in that the organic photodetector 30 further includes a third electrode 230 arranged between the first electrode 210 and the second electrode 220. In FIG. 4, the same reference numerals as those in FIG. 2 denote the same constituent elements, and redundant descriptions thereof are omitted.

Referring to FIG. 4, the organic photodetector 30 may include the substrate 100, the first electrode 210, the second electrode 220, the third electrode 230, an insulating layer 240, and the active layer 300.

In an embodiment, the first electrode 210, the second electrode 220, and the third electrode 230 may be arranged on the substrate 100. The first electrode 210, the second electrode 220, and the third electrode 230 may be apart from one another in the first direction DR1 crossing the direction DR3 that is perpendicular to the substrate 100.

In an embodiment, the first electrode 210, the second electrode 220, and the third electrode 230 may be provided on the same layer and may include the same material. However, the disclosure is not limited thereto. For example, one of the first electrode 210, the second electrode 220, and the third electrode 230 may be arranged on a different layer, and may include a different material.

In an embodiment, the first electrode 210, the second electrode 220, and the third electrode 230 may be apart from one another in the first direction DR1 crossing the direction DR3 that is perpendicular to the substrate 100.

In an embodiment, the insulating layer 240 may be arranged on the third electrode 230. The insulating layer 240 may directly cover the third electrode 230. In an embodiment, the insulating layer 240 may include an inorganic insulating material such as silicon oxide, silicon nitride, silicon oxynitride, aluminum oxide, titanium oxide, tantalum oxide, hafnium oxide, and the like.

In an embodiment, the active layer 300 may be arranged on the first electrode 210, the second electrode 220, and the third electrode 230. For example, the active layer 300 may directly cover the first electrode 210, the second electrode 220, and the insulating layer 240.

In an embodiment, the active layer 300 may receive light from the outside to generate excitons, and then separate the generated excitons into holes and electrons. The active layer 300 may include the p-type organic semiconductor and the n-type organic semiconductor. In this state, the p-type organic semiconductor may serve as an electron donor, and the n-type organic semiconductor may serve as an electron acceptor.

In an embodiment, when photocharges are formed by receiving light in a state in which a (+) electric potential is applied to the third electrode 230, a negative charge channel is formed around the insulating layer 240 so that a photocurrent may flow through the negative charge channel. In this state, as described above, when a (+) electric potential is applied to the first electrode 210, and a (−) electric potential is applied to the second electrode 220, the holes separated in the active layer 300 may move toward the second electrode 220, and the electrons separated in the active layer 300 may move toward the first electrode 210. Accordingly, a photocurrent may be formed in the direction DR1 from the first electrode 210 to the second electrode 220. Furthermore, when a (−) electric potential is applied to the first electrode 210, and a (+) electric potential is applied to the second electrode 220, the holes separated in the active layer 300 may move toward the first electrode 210, and the electrons separated in the active layer 300 may move toward the second electrode 220. Accordingly, a photocurrent may be formed in the direction DR1' from the second electrode 220 to the first electrode 210.

In an embodiment, in the state in which a (−) electric potential is applied to the third electrode 230, when photocharges are formed by receiving light, a positive charge channel is formed around the insulating layer 240 so that a photocurrent may flow in the positive charge channel. In this state, as described above, when a (+) electric potential is applied to the first electrode 210, and a (−) electric potential is applied to the second electrode 220, the holes separated in the active layer 300 may move toward the second electrode 220, and the electrons separated in the active layer 300 may move toward the first electrode 210. Accordingly, a photocurrent may be formed in the direction DR1 from the first electrode 210 to the second electrode 220. Furthermore, when a (−) electric potential is applied to the first electrode 210, and a (+) electric potential is applied to the second electrode 220, the holes separated in the active layer 300 may move toward the first electrode 210, and the electrons separated in the active layer 300 may move toward the second electrode 220. Accordingly, a photocurrent may be formed in the direction DR1' from the second electrode 220 to the first electrode 210.

Figure 5:
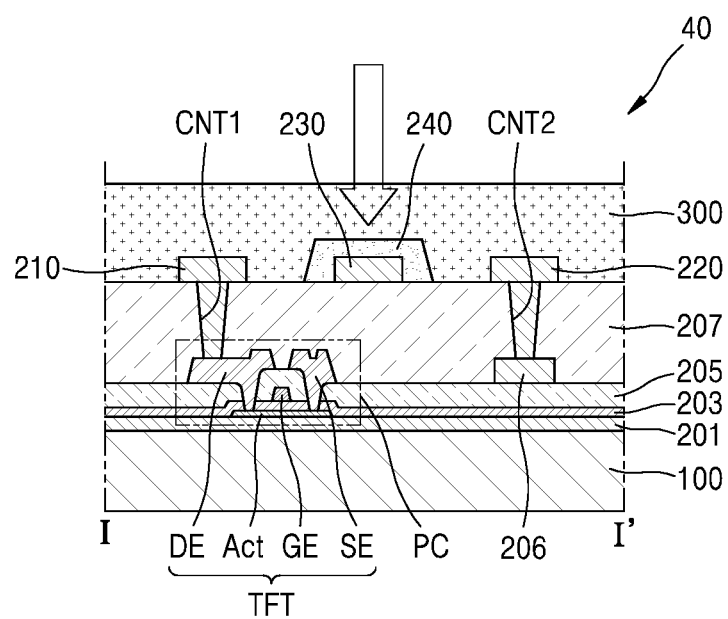
FIG. 5 is a schematic cross-sectional view of an organic photodetector according to an embodiment.
Figure 5:
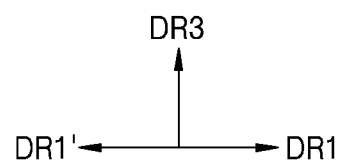

FIG. 5 is a schematic cross-sectional view of an organic photodetector 40 according to an embodiment. The embodiment of FIG. 5 differs from the embodiment of FIG. 4 in that organic photodetector 40 further includes the thin film transistor TFT and the connection electrode 206 provided between the substrate 100 and the active layer 300. In FIG. 5, the same reference numerals as those in FIG. 4 denote the same constituent elements, and redundant descriptions thereof are omitted.

Referring to FIG. 5, the organic photodetector 40 may include the substrate 100, the thin film transistor TFT, the connection electrode 206, the first electrode 210, the second electrode 220, the third electrode 230, the insulating layer 240, and the active layer 300.

In an embodiment, the buffer layer 201 may be arranged on the substrate 100, and the thin film transistor TFT may be arranged on the buffer layer 201. The thin film transistor TFT may include the semiconductor layer Act, the gate electrode GE, the source electrode SE, and the drain electrode DE. In an embodiment, the connection electrode 206 may be arranged on the interlayer insulating layer 205.

The organic insulating layer 207 may be provided to cover the source electrode SE, the drain electrode DE, and the connection electrode 206. The first electrode 210, the second electrode 220, and the third electrode 230 may be arranged on the organic insulating layer 207. In an embodiment, the insulating layer 240 may be arranged on the organic insulating layer 207. The insulating layer 240 may cover the third electrode 230.

In an embodiment, the active layer 300 may be arranged on the organic insulating layer 207. The active layer 300 may cover the first electrode 210, the second electrode 220, and the third electrode 230. For example, the active layer 300 may cover the third electrode 230 by covering the insulating layer 240 that covers the third electrode 230, not directly covering the third electrode 230.

In an embodiment, the first electrode 210 may be electrically connected to the drain electrode DE through the first contact hole CNT1 defined in the organic insulating layer 207. However, the disclosure is not limited thereto. The first electrode 210 may be electrically connected to the source electrode SE.

Furthermore, in an embodiment, the connection electrode 206 may be arranged on the interlayer insulating layer 205. The second electrode 220 may be electrically connected to the connection electrode 206 through the second contact hole CNT2 defined in the organic insulating layer 207. The second electrode 220 may receive a voltage through the connection electrode 206. The connection electrode 206 may include the same material as the source electrode SE and the drain electrode DE.

Although FIG. 3 illustrates the first electrode 210 is electrically connected to the thin film transistor TFT, and the second electrode 220 is electrically connected to the connection electrode 206, this is merely exemplary, and the disclosure is not limited thereto. For example, the first electrode 210 may be electrically connected to the connection electrode 206, and the second electrode 220 may be electrically connected to the thin film transistor TFT. Alternatively, the first electrode 210 and the second electrode 220 may be electrically connected to the thin film transistors TFT that are different from each other.

Furthermore, a conductive layer may be arranged on the interlayer insulating layer 205 to correspond to the third electrode 230. The third electrode 230 may be electrically connected to a conductive layer through a contact hole defined in the organic insulating layer 207, and may receive a voltage.

Figure 6:
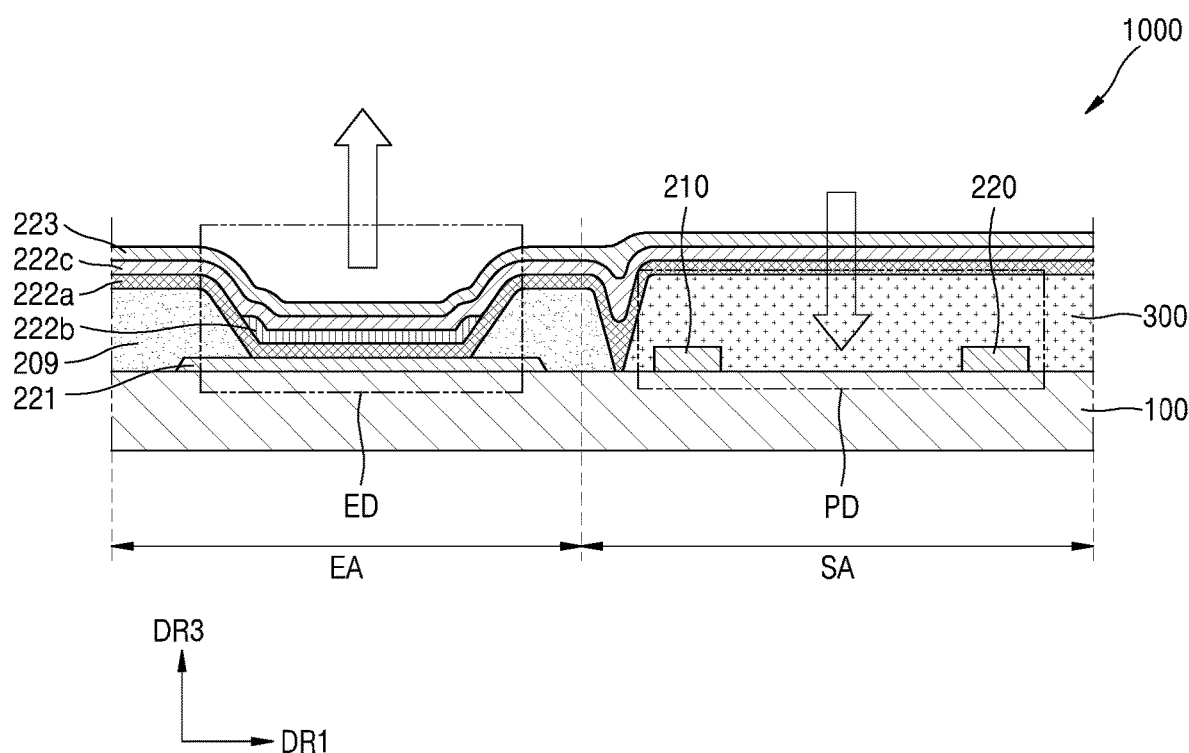
FIG. 6 is a schematic cross-sectional view of an electronic device according to an embodiment.

FIG. 6 is a schematic cross-sectional view of an electronic device 1000 according to an embodiment.

Referring to FIG. 6, the electronic device 1000 according to the present embodiment may include a light-emitting element ED and an organic photodetector PD. In an embodiment, the light-emitting element ED may include a pixel electrode 221, a light-emitting layer 222b, and a counter electrode 223, and the organic photodetector PD may include the first electrode 210, the second electrode 220, and the active layer 300.

In an embodiment, the pixel electrode 221, the first electrode 210, and the second electrode 220 may be arranged on the substrate 100. In an embodiment, the pixel electrode 221, the first electrode 210 and the second electrode 220 may be provided on the same layer and may include the same material.

A pixel defining layer 209 may cover an edge of the pixel electrode 221 and may be arranged on the organic insulating layer 207. The pixel defining layer 209 may include an opening that exposes at least a part of an upper surface of the pixel electrode 221. As the pixel defining layer 209 increases a distance between the edge of the pixel electrode 221 and the counter electrode 223, the generation of ark and the like at the edge of the pixel electrode 221 may be prevented.

The pixel defining layer 209 may include an organic insulating material such as polyimide, polyamide, acryl resin, benzocyclobutene, hexamethyldisiloxane (HMDSO), phenol resin, and the like, and may be formed by a method such as spin coating and the like.

The light-emitting layer 222b may be arranged in the opening of the pixel defining layer 209. The light-emitting layer 222b may include an organic material including a fluorescent or phosphorescent material that emits red, green, blue, or white light. The light-emitting layer 222b may include an organic light-emitting layer including a low molecular weight organic material or a polymer organic material. For example, the light-emitting layer 222b, as an organic light-emitting layer, may include copper phthalocyanine, tris-8-hydroxyquinoline aluminum, poly-phenylenevinylene (PPV)-based materials, or polyfluorene-based materials.

In an embodiment, the light-emitting layer 222b may include a host material and a dopant material. The dopant material, which is a material that emits light of a specific color, may include a light-emitting material. The light-emitting material may include at least one of a phosphorescent dopant, a fluorescent dopant, or a quantum dot. The host material, as a main material of the light-emitting layer 222b, may assist the dopant material to emit light.

In an embodiment, the counter electrode 223 may be arranged on the light-emitting layer 222b. The counter electrode 223 may be a transmissive electrode or a reflective electrode. In an embodiment, the counter electrode 223 may be a transparent or semi-transparent electrode, and may include a metal thin film having a low work function including Li, Ca, LiF/Ca, LiF/Al, Al, Ag, Mg, and compounds thereof. Furthermore, the counter electrode 223 may further include a transparent conductive oxide (TCO) film including ITO, IZO, ZnO, $In_2O_3$, and the like, in addition to the metal thin film.

In an embodiment, a first common layer 222a may be arranged between the pixel electrode 221 and the light-emitting layer 222b, and a second common layer 222c may be arranged between the light-emitting layer 222b and the counter electrode 223.

In an embodiment, a hole transport region may be defined between the pixel electrode 221 and the light-emitting layer 222b, and an electron transport region may be defined between the light-emitting layer 222b and the counter electrode 223.

The hole transport region may have a single layer structure or a multilayer structure. For example, the first common layer 222a may be arranged in the hole transport region. In an embodiment, the first common layer 222a may include at least one of a hole injection layer (HIL), a hole transport layer (HTL), or an electron blocking layer (EBL).

For example, the first common layer 222a may have a single layer structure or a multilayer structure. When the first common layer 222a has a multilayer structure, the first common layer 222a may include the hole injection layer HIL and the hole transport layer HTL, the hole injection layer HIL and an electron blocking layer (EBL), the hole transport layer HTL and the electron blocking layer EBL, or the hole injection layer HIL, the hole transport layer HTL, and the electron blocking layer EBL, which are sequentially stacked on the pixel electrode 221. However, the disclosure is not limited thereto.

The first common layer 222a may include at least one material selected from the group consisting of m-MTDATA, TDATA, 2-TNATA, NPB(NPD), TPD, spiro-TPD, spiro-NPB, methylated-NPB, TAPC, HMTPD, 4,4',4''-tris(N-carbazolyl)triphenylamine (TCTA), polyaniline/dodecylbenzenesulfonic acid (pani/DBSA), polyaniline/camphor sulfonic acid (Pani/CSA), poly(3,4-ethylenedioxythiophene)/poly(4-styrenesulfonate) (PEDOT/PSS), and polyaniline/poly(4-styrenesulfonate) (PANI/PSS).

The electron transport region may have a single layer structure or a multilayer structure. For example, the second common layer 222c may be arranged in the electron transport region. In an embodiment, the second common layer 222c may include at least one of an electron injection layer (EIL), an electron transport layer (ETL), and a hole blocking layer (HBL).

For example, the second common layer 222c may have a single layer structure or a multilayer structure. When the second common layer 222c has a multilayer structure, the second common layer 222c may include the electron transport layer ETL and the electron injection layer EIL, the hole blocking layer HBL and the electron injection layer EIL, the hole blocking layer HBL and the electron transport layer ETL, or the hole blocking layer HBL, the electron transport layer ETL, and the electron injection layer EIL, which are sequentially stacked on the light-emitting layer 222b. However, the disclosure is not limited thereto.

The second common layer 222c may include at least one compound selected from among 2,9-dimethyl-4,7-diphenyl-1,10-phenanthroline (BCP), 4,7-diphenyl-1,10-phenanthroline (Bphen), Alq3, BAlq, 3-(biphenyl-4-yl)-5-(4-tert-butylphenyl)-4-phenyl-4H-1,2,4-triazole (TAZ), and NTAZ.

In an embodiment, the substrate 100 may include a light-emitting area EA and a sensing area SA. For example, it may be understood that the electronic device 1000 includes the light-emitting area EA and the sensing area SA. In an embodiment, the light-emitting element ED may be arranged to correspond to the light-emitting area EA, and the organic photodetector PD may be arranged to correspond to the sensing area SA.

In an embodiment, the pixel electrode 221 and the light-emitting layer 222b of the light-emitting element ED may be arranged to correspond to the light-emitting area EA. In an embodiment, the first electrode 210, the second electrode 220, and the active layer 300 of the organic photodetector PD may be arranged to correspond to the sensing area SA. However, the first common layer 222a, the second common layer 222c, and the counter electrode 223 of the light-emitting element ED may be arranged entirely in the light-emitting area EA and the sensing area SA. For example, the first common layer 222a, the second common layer 222c, and the counter electrode 223 may be arranged on the active layer 300 of the organic photodetector PD.

Figure 7:
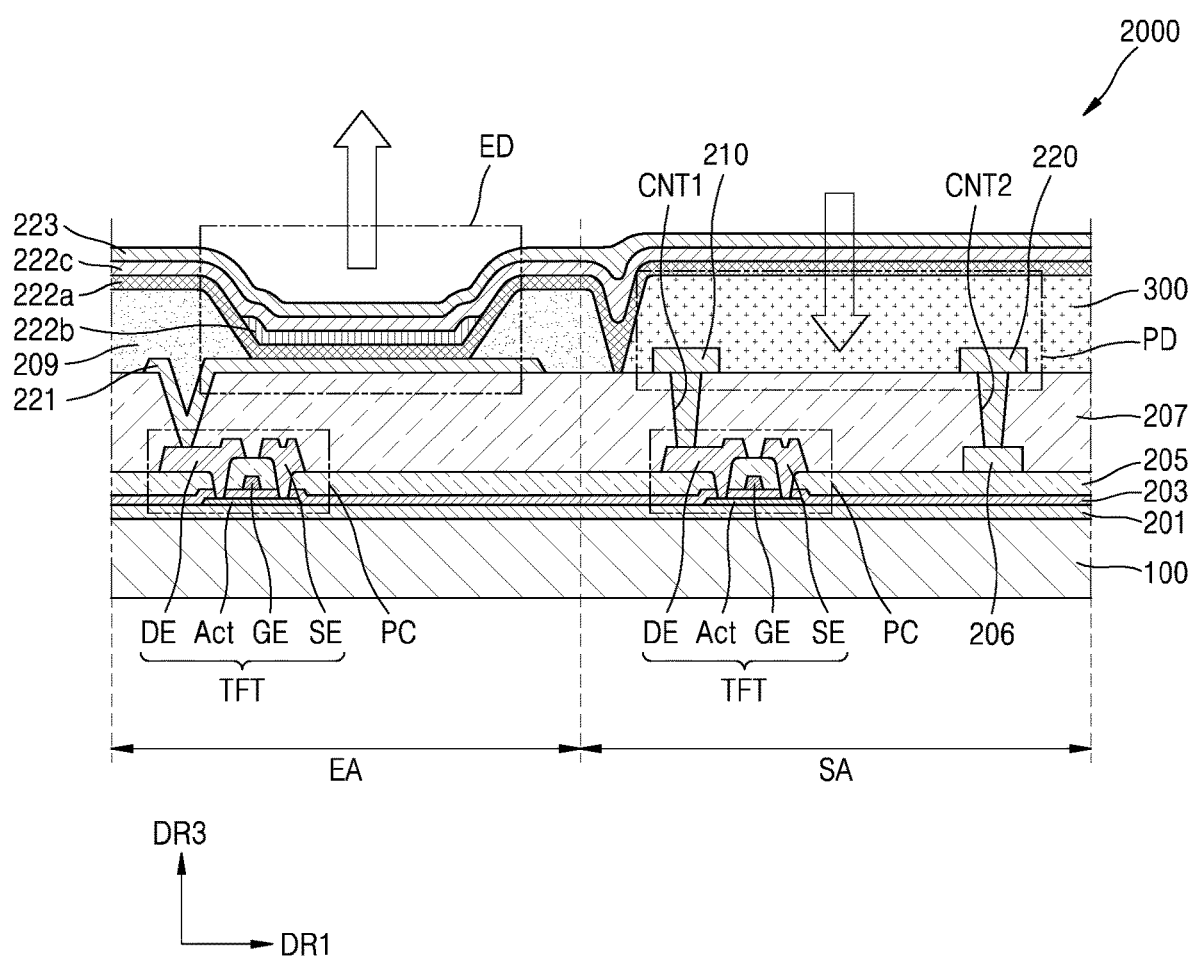
FIG. 7 is a schematic cross-sectional view of an electronic device according to an embodiment.

FIG. 7 is a schematic cross-sectional view of an electronic device 2000 according to an embodiment. The embodiment of FIG. 7 differs from the embodiment of FIG. 6 in that the electronic device 2000 further includes the thin film transistor TFT arranged between the substrate 100 and the light-emitting element ED, and the thin film transistor TFT arranged between the substrate 100 and the organic photodetector PD. In FIG. 7, the same reference numerals as those in FIG. 6 denote the same constituent elements, and redundant descriptions thereof are omitted.

Referring to FIG. 7, the electronic device 2000 according to the present embodiment may include the substrate 100, thin film transistors TFTs, the connection electrode 206, the light-emitting element ED, and the organic photodetector PD. The light-emitting element ED may include the pixel electrode 221, the first common layer 222a, the light-emitting layer 222b, the second common layer 222c, and the counter electrode 223, which are sequentially stacked. The organic photodetector PD may include the first electrode 210, the second electrode 220, and the active layer 300. For example, the organic photodetector PD may be provided in a horizontally arranged structure.

In an embodiment, the thin film transistor TFT may be arranged between the substrate 100 and the light-emitting element ED. The thin film transistor TFT may include the semiconductor layer Act, the gate electrode GE, the source electrode SE, and the drain electrode DE. The thin film transistor TFT may be electrically connected to the light-emitting element ED to drive the light-emitting element ED. For example, one of the source electrode SE and the drain electrode DE of the thin film transistor TFT may be electrically connected to the pixel electrode 221 of the light-emitting element ED.

In an embodiment, the thin film transistor TFT and the connection electrode 206 may be arranged between the substrate 100 and the organic photodetector PD. The first electrode 210 of the organic photodetector PD may be electrically connected to one of the source electrode SE and the drain electrode DE of the thin film transistor TFT, and the second electrode 220 of the organic photodetector PD may be electrically connected to the connection electrode 206. However, the disclosure is not limited thereto. The first electrode 210 of the organic photodetector PD may be electrically connected to the connection electrode 206, and the second electrode 220 of the organic photodetector PD may be electrically connected to the thin film transistor TFT. Alternatively, all of the first electrode 210 and the second electrode 220 of the organic photodetector PD may be electrically connected to the thin film transistors TFT that are different from each other.

Figure 8:
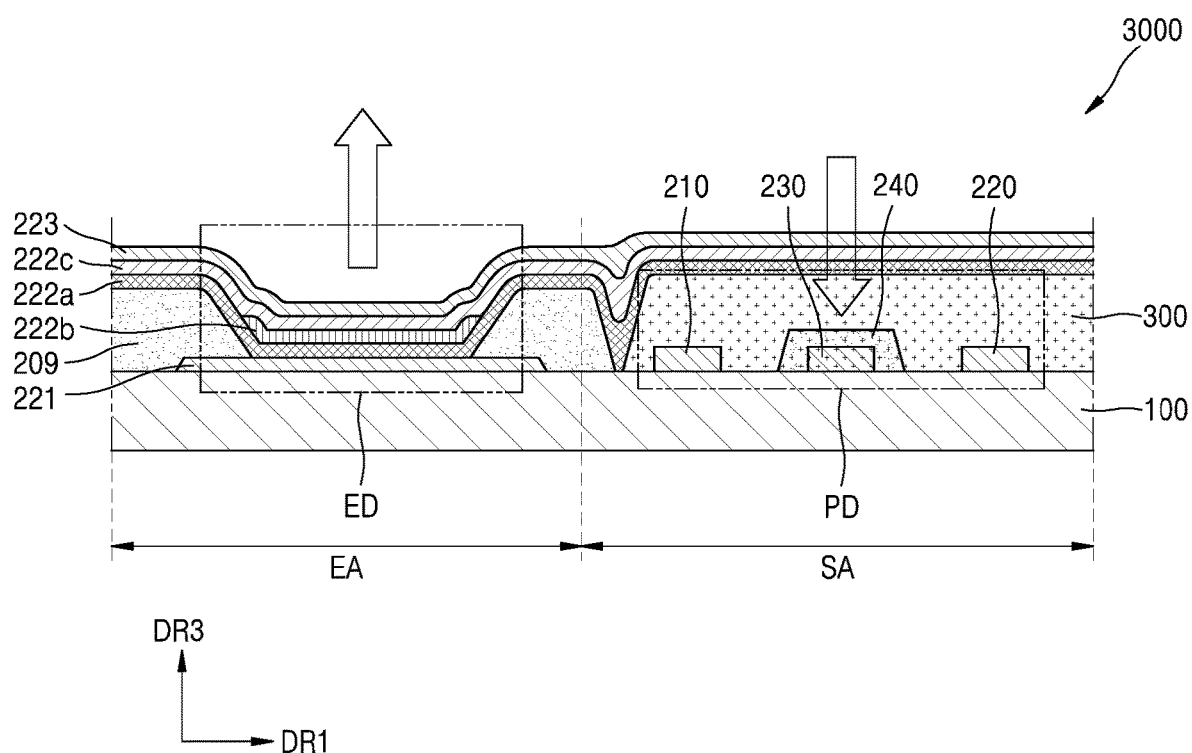
FIG. 8 is a schematic cross-sectional view of an electronic device according to an embodiment.

FIG. 8 is a schematic cross-sectional view of an electronic device 3000 according to an embodiment.

The embodiment of FIG. 8 differs from the embodiment of FIG. 6 in that the electronic device 3000 further include the third electrode 230 and the insulating layer 240. In FIG. 8, the same reference numerals as those in FIG. 6 denote the same constituent elements, and redundant descriptions thereof are omitted.

Referring to FIG. 8, the electronic device 3000 according to the present embodiment may include the light-emitting element ED and the organic photodetector PD. In an embodiment, the light-emitting element ED may include the pixel electrode 221, the light-emitting layer 222b, and the counter electrode 223, and the organic photodetector PD may include the first electrode 210, the second electrode 220, the third electrode 230, the insulating layer 240, and the active layer 300. The organic photodetector PD of FIG. 8 may be also provided in a horizontally arranged structure.

In an embodiment, the organic photodetector PD may further include the third electrode 230 and the insulating layer 240 covering the third electrode 230, between the first electrode 210 and the second electrode 220. The third electrode 230 may be arranged on the same layer as the pixel electrode 221, and may include the same material.

In an embodiment, the first electrode 210, the second electrode 220, and the third electrode 230 may be apart from one another in the first direction DR1 crossing the direction DR3 that is perpendicular to the substrate 100. In an embodiment, the active layer 300 may be arranged on the first electrode 210, the second electrode 220, and the third electrode 230. For example, the active layer 300 may directly cover the first electrode 210, the second electrode 220, and the insulating layer 240.

Figure 9:
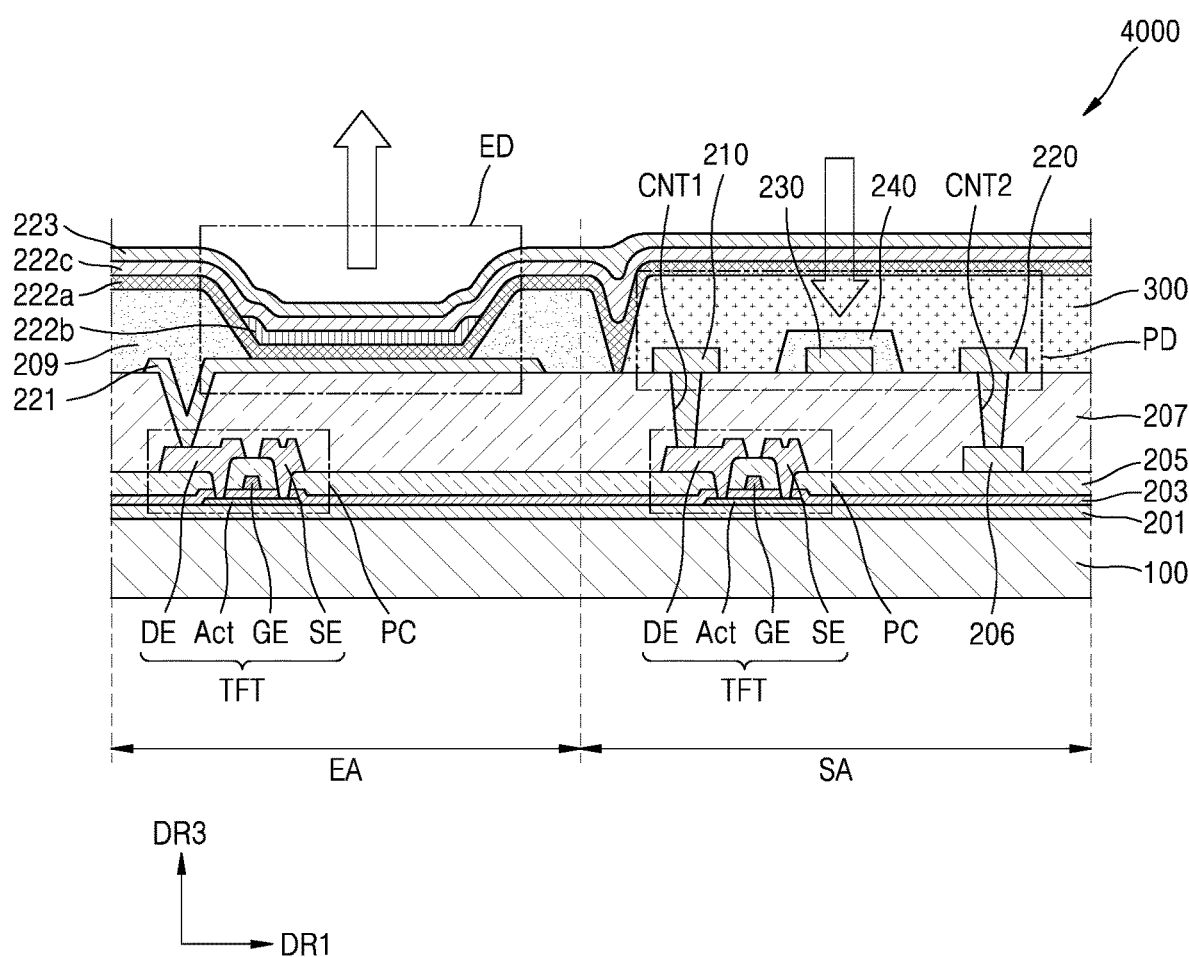
FIG. 9 is a schematic cross-sectional view of an electronic device according to an embodiment.

FIG. 9 is a schematic cross-sectional view of an electronic device 4000 according to an embodiment. The embodiment of FIG. 9 differs from the embodiment of FIG. 8 in that the electronic device 4000 further includes the thin film transistor TFT arranged between the substrate 100 and the light-emitting element ED, and the thin film transistor TFT arranged between the substrate 100 and the organic photodetector PD. In FIG. 9, the same reference numerals as those in FIG. 8 denote the same constituent elements, and redundant descriptions thereof are omitted.

Referring to FIG. 9, the electronic device 4000 according to the present embodiment may include the substrate 100, the thin film transistors TFTs, the connection electrode 206, the light-emitting element ED, and the organic photodetector PD. The light-emitting element ED may include the pixel electrode 221, the first common layer 222a, the light-emitting layer 222b, the second common layer 222c, and the counter electrode 223, which are sequentially stacked. The organic photodetector PD may include the first electrode 210, the second electrode 220, the third electrode 230, the insulating layer 240, and the active layer 300. For example, the organic photodetector PD may be provided in a horizontally arranged structure.

In an embodiment, the thin film transistor TFT may be arranged between the substrate 100 and the light-emitting element ED. The thin film transistor TFT may be electrically connected to the light-emitting element ED to drive the light-emitting element ED.

In an embodiment, the thin film transistor TFT and the connection electrode 206 may be arranged between the substrate 100 and the organic photodetector PD. The first electrode 210 of the organic photodetector PD may be electrically connected to one of the source electrode SE and the drain electrode DE of the thin film transistor TFT, and the second electrode 220 of the organic photodetector PD may be electrically connected to the connection electrode 206. However, the disclosure is not limited thereto.

Figure 10:
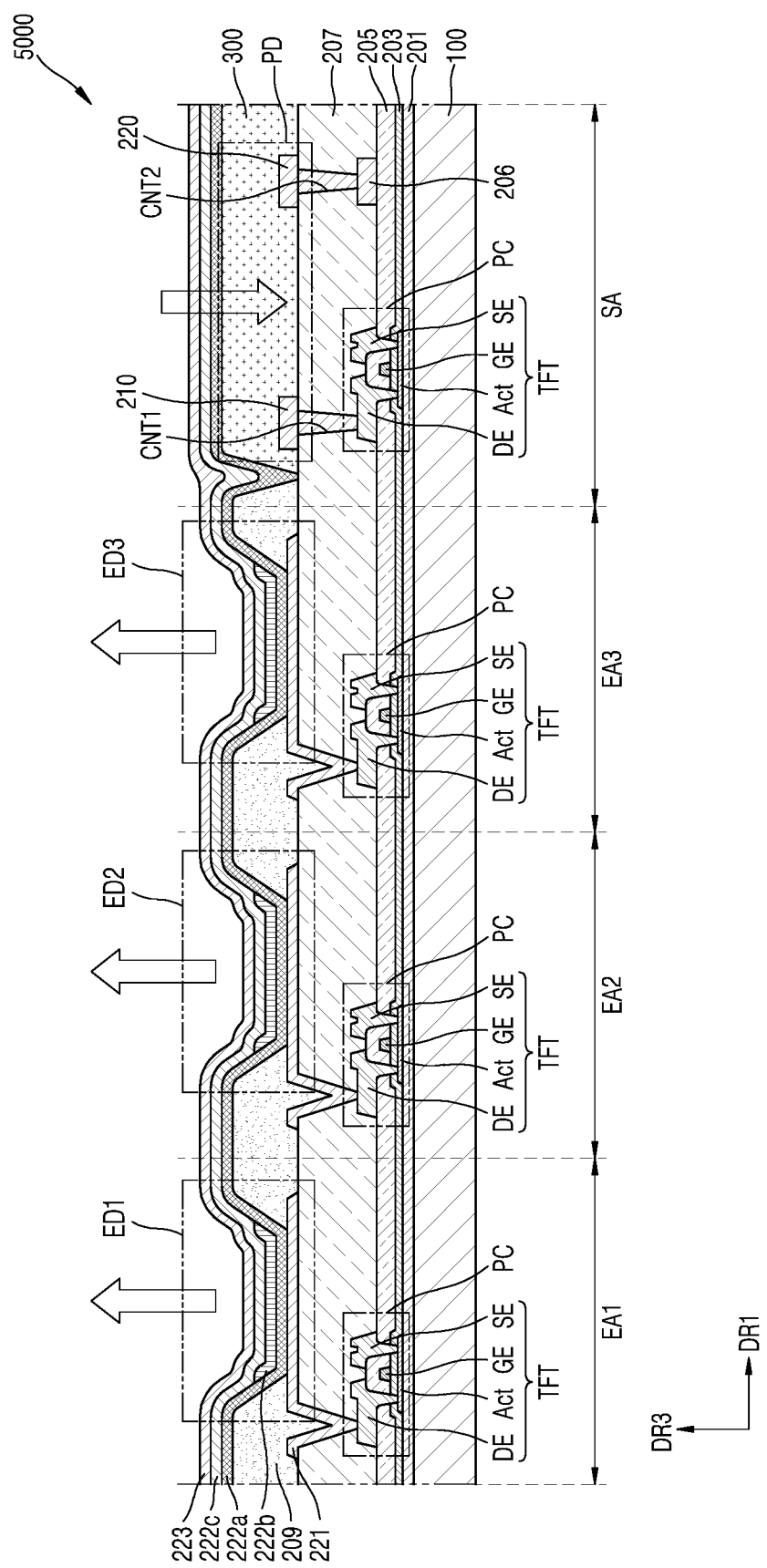
FIGS. 10 and 11 are schematic cross-sectional views of electronic devices according to embodiments.
Figure 11:
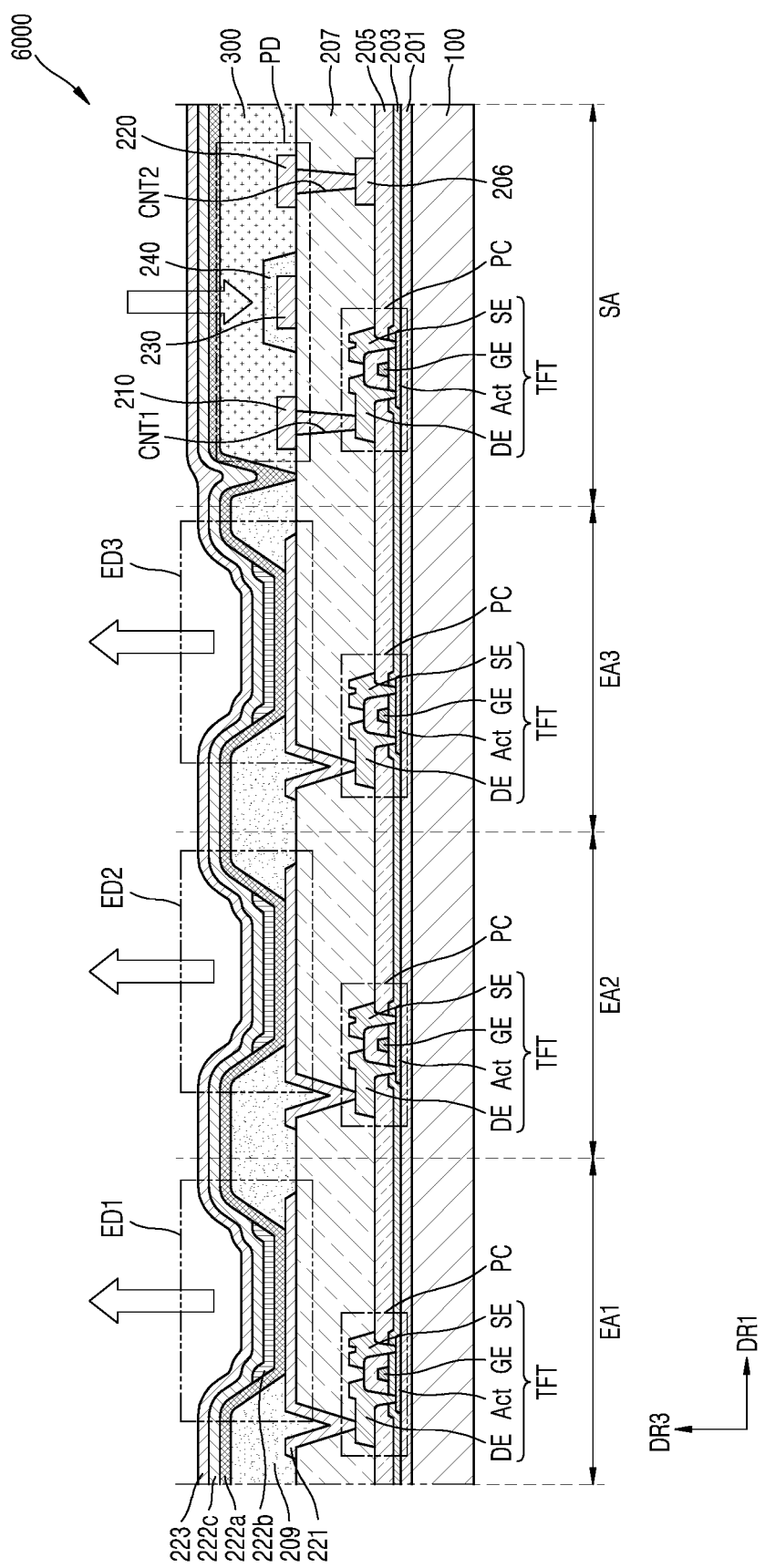

FIGS. 10 and 11 are schematic cross-sectional views of electronic devices 5000 and 6000 according to embodiments.

The embodiments of FIGS. 10 and 11 differ from the embodiments of FIGS. 7 and 9 in that the electronic devices 5000 and 6000 each include a plurality of the light-emitting elements ED1, ED2, and ED3. In FIGS. 10 and 11, the same reference numerals as those in FIGS. 7 and 9 denote the same constituent elements, and redundant descriptions thereof are omitted.

Referring to FIGS. 10 and 11, the electronic devices 5000 and 6000 according to the present embodiments may each include a first light-emitting element ED1, a second light-emitting element ED2, a third light-emitting element ED3, and the organic photodetector PD.

In an embodiment, the first light-emitting element ED1, the second light-emitting element ED2 and the third light-emitting element ED3 may be arranged to correspond to a first light-emitting area EA1, a second light-emitting area EA2, and a third light-emitting area EA3, respectively. In an embodiment, the first light-emitting element ED1, the second light-emitting element ED2, and the third light-emitting element ED3 may each include the pixel electrode 221, the first common layer 222a, the light-emitting layer 222b, the second common layer 222c, and the counter electrode 223, which are sequentially stacked.

In an embodiment, the first common layer 222a, the second common layer 222c, and the counter electrode 223 may be integrally provided to correspond to the first light-emitting area EA1, the second light-emitting area EA2, and the third light-emitting area EA3, and the pixel electrode 221 and the light-emitting layer 222b may be patterned to correspond to each of the light-emitting areas EA1, EA2, and EA3.

In an embodiment, the first light-emitting element ED1 may be arranged to correspond to the first light-emitting area EA1 to emit light of a first color, the second light-emitting element ED2 may be arranged to correspond to the second light-emitting area EA2 to emit light of a second color, and the third light-emitting element ED3 may be arranged to correspond to the third light-emitting area EA3 to emit light of a third color. In this state, the light of a first color, the light of a second color, and the light of a third color may be red light, green light, and blue light, respectively. However, the disclosure is not limited thereto. For example, the electronic devices 5000 and 6000 may emit full color light. When the light of a first color, the light of a second color, and the light of a third color are a combination such that mixed light thereof is white light, the light of a first color, the light of a second color, and the light of a third color are not limited to the red light, the green light, and the blue light, respectively.

In the electronic devices 5000 and 6000, the first light-emitting element ED1, the second light-emitting element ED2, the third light-emitting element ED3, and the organic photodetector PD may be subpixels forming one pixel. In an embodiment, one pixel may include one or more organic photodetectors PDs.

In an embodiment, the electronic devices 5000 and 6000 may be display devices. The electronic devices 5000 and 6000 may be a full color display device that includes the organic photodetector PD and all of the first light-emitting element ED1, the second light-emitting element ED2, and the third light-emitting element ED3, thereby having a photodetection function.

Figure 12:
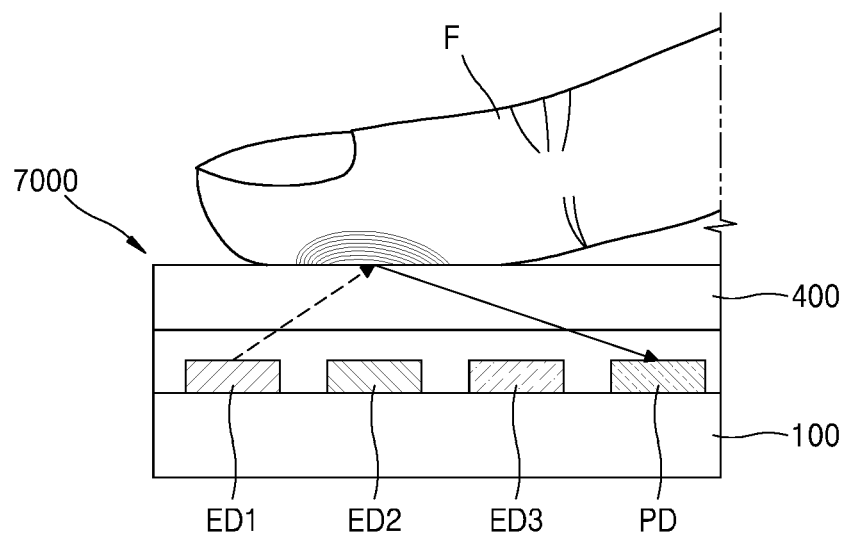
FIGS. 12 and 13 are schematic cross-sectional views of electronic devices according to embodiments.
Figure 13:
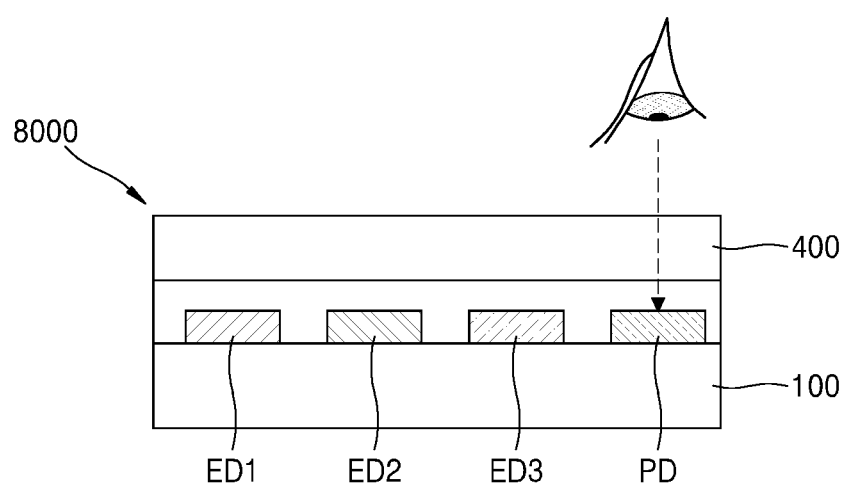

FIGS. 12 and 13 are schematic cross-sectional views of electronic devices 7000 and 8000 according to embodiments.

Referring to FIGS. 12 and 13, the electronic devices 7000 and 8000 according to the present embodiments may each include the substrate 100 and a cover window 400. The cover window 400 may serve to protect the electronic devices 7000 and 8000 by covering the same. The cover window 400 may include a transparent material. For example, the cover window 400 may include glass or plastic. However, the disclosure is not limited thereto. For example, the cover window 400 may be omitted.

In an embodiment, the electronic devices 7000 and 8000 may each include the first light-emitting element ED1, the second light-emitting element ED2, the third light-emitting element ED3, and the organic photodetector PD, which are provided between the substrate 100 and the cover window 400. Although FIGS. 12 and 13 illustrate that each one of the first light-emitting element ED1, the second light-emitting element ED2, the third light-emitting element ED3, and the organic photodetector PD is arranged between the substrate 100 and the cover window 400, the disclosure is not limited thereto. For example, a plurality of first light-emitting elements ED1, a plurality of second light-emitting elements ED2, a plurality of third light-emitting elements ED3, and a plurality of organic photodetectors PDs may be arranged between the substrate 100 and the cover window 400.

In an embodiment, the light-emitting elements ED1, ED2, and ED3 may emit light of different wavelengths from one another. For example, the first light-emitting element ED1 may emit light in a red wavelength band, the second light-emitting element ED2 may emit light in a green wavelength band, and the third light-emitting element ED3 may emit light in a blue wavelength band.

As illustrated in FIG. 12, the electronic device 7000 according to the present embodiment may have a function of sensing an object in contact with the electronic device 7000, for example, a fingerprint of a finger F. As at least part of reflective light that is emitted from the light-emitting elements ED1, ED2, and ED3 and reflected from the fingerprint of a user is incident again on the organic photodetector PD, the organic photodetector PD may detect the reflective light. As ridgelines of a finger pattern of the finger F are in close contact with an upper surface of the cover window 400, the organic photodetector PD may obtain image information about the fingerprint pattern of a user, for example, the ridgelines.

As illustrated in FIG. 13, the electronic device 8000 according to the present embodiment may detect an object that is not in contact with the electronic device 8000.

When the organic photodetectors 10-40 and PD have a structure of being arranged in the direction DR3 perpendicular to the substrate 100 (hereinafter, referred to as the vertically arranged structure), the organic photodetectors 10-40 and PD may include the first electrode 210 arranged on the same layer as the pixel electrode 221 and the second electrode 220 arranged on the same layer as the counter electrode 223. Furthermore, the organic photodetectors 10-40 and PD having the vertically arranged structure may further include the first common layer 222a, the active layer 300, the second common layer 222c, which are sequentially arranged between the first electrode 210 and the second electrode 220. In this state, the first common layer 222a may include at least one layer of the hole injection layer HIL, the hole transport layer HTL, and the electron blocking layer EBL, and the second common layer 222c may include at least one layer of the electron injection layer EIL, the electron transport layer ETL, and the hole blocking layer HBL. In other words, the organic photodetectors 10-40 and PD having the vertically arranged structure may include the first electrode 210, the first common layer 222a, the active layer 300, the second common layer 222c, and the second electrode 220, which are sequentially stacked in the direction DR3 perpendicular to the substrate 100.

As the electric charges formed in the active layer 300 during the driving of the organic photodetectors 10-40 and PD having the vertically arranged structure necessarily pass through the first common layer 222a and/or the second common layer 222c, the properties of the organic photodetectors 10-40 and PD may be affected by the first common layer 222a and/or the second common layer 222c. For example, when an energy level difference exists between the active layer 300 and the first common layer 222a, between layers included in the first common layer 222a, between the active layer 300 and the second common layer 222c, and/or between the second common layer 222c, a problem is generated in transporting hole and/or electrons so that the photodetection efficiency may be deteriorated. Furthermore, as the holes and electrons separated in the active layer 300 pass through various layers, a response speed may be deteriorated and consumed power may be increased. Furthermore, the holes and electrons separated in the active layer 300 may be extinguished due to the electric potential difference.

According to an embodiment, the organic photodetectors 10-40 and PD may be provided in a horizontally arranged structure. For example, the organic photodetectors 10-40 and PD may each include the first electrode 210, the second electrode 220, and the active layer 300, and the first electrode 210 and the second electrode 220 of the organic photodetectors 10-40 and PD may be apart from each other in the first direction DR1 crossing the direction DR3 that is perpendicular to the substrate 100. Furthermore, the active layer 300 of the organic photodetectors 10-40 and PD may directly cover the first electrode 210 and the second electrode 220 that are horizontally arranged in the direction DR1.

In an embodiment, as the organic photodetectors 10-40 and PD are provided in the horizontally arranged structure, not in the vertically arranged structure, the electric charges separated in the active layer 300 may be transported or moved directly to the first electrode 210 and the second electrode 220, without passing through the common layers 222a and 222c. Accordingly, as the electric charges separated in the active layer 300 are transported or moved directly to the first electrode 210 and the second electrode 220, without passing through the common layers 222a and 222c, the photodetection efficiency may be improved. In detail, as the electric charges separated in the active layer 300 are transported or moved directly to the first electrode 210 and the second electrode 220, without passing through the common layers 222a and 222c, the transport problem of electric charges due to the energy level may be prevented, and the response speed may be increased so that the consumed power may be reduced. Furthermore, as the extinguishment of the electric charges separated in the active layer 300 due to the electric potential difference may be prevented or reduced, the photodetection efficiency of the organic photodetectors 10-40 and PD may be increased or improved.

In an embodiment, the organic photodetectors 10-40 and PD may each include the first electrode 210, the second electrode 220, the third electrode 230, the insulating layer 240, and the active layer 300. Even in this case, the organic photodetectors 10-40 and PD may be provided in the horizontally arranged structure.

According to one or more embodiments configured as above, the organic photodetector with improved photodetection efficiency, and the electronic device including the organic photodetector, may be implemented. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic photodetector comprising:
   a substrate;
   a first electrode arranged on the substrate;
   a second electrode arranged on the substrate and spaced apart from the first electrode in a first direction crossing a direction perpendicular to the substrate; and
   an active layer that generates a photocurrent in response to incident light, the active layer covering the first electrode and the second electrode.

2. The organic photodetector of claim 1, wherein the first electrode and the second electrode are arranged in a same layer as one another.

3. The organic photodetector of claim 1, wherein the active layer comprises:
   a p-type semiconductor layer comprising a p-type organic semiconductor; and
   an n-type semiconductor layer comprising an n-type organic semiconductor.

4. The organic photodetector of claim 3, wherein the active layer is a mixed layer of the p-type organic semiconductor and the n-type organic semiconductor.

5. The organic photodetector of claim 3, wherein
   the p-type organic semiconductor comprises SubPc, CuPc, DBP, or any combination thereof, and
   the n-type organic semiconductor comprises C60 fullerene, C70 fullerene, or any combination thereof.

6. The organic photodetector of claim 1, further comprising:
   a third electrode arranged on the substrate; and
   an insulating layer covering the third electrode.

7. The organic photodetector of claim 6, wherein the insulating layer covers an upper surface and a side surface of the third electrode.

8. The organic photodetector of claim 6, wherein the active layer covers the insulating layer.

9. The organic photodetector of claim 6, wherein the third electrode is arranged in a same layer as the first electrode and the second electrode.

10. An electronic device comprising:
    a substrate;
    an organic photodetector comprising a first electrode arranged on the substrate, a second electrode arranged on the substrate and spaced apart from the first electrode in a first direction crossing a direction perpendicular to the substrate, and an active layer that generates a photocurrent in response to incident light and that covers the first electrode and the second electrode; and
    a light-emitting element comprising a pixel electrode arranged on the substrate, a counter electrode arranged on the pixel electrode, and a light-emitting layer that emits light in response to a driving current, the light-emitting layer being arranged between the pixel electrode and the counter electrode.

11. The electronic device of claim 10, wherein the first electrode and the second electrode are arranged in a same layer as one another.

12. The electronic device of claim 10, wherein the active layer comprises:
    a p-type semiconductor layer comprising a p-type organic semiconductor; and
    an n-type semiconductor layer comprising an n-type organic semiconductor.

13. The electronic device of claim 12, wherein the active layer is a mixed layer of the p-type organic semiconductor and the n-type organic semiconductor.

14. The electronic device of claim 10, further comprising:
a third electrode arranged on the substrate; and
an insulating layer covering the third electrode.

15. The electronic device of claim 14, wherein the third electrode is arranged in a same layer as the first electrode and the second electrode.

16. The electronic device of claim 10, wherein the pixel electrode is arranged in a same layer as the first electrode.

17. An electronic device comprising:
a substrate;
an organic photodetector comprising:
  a first electrode arranged on the substrate;
  a second electrode arranged on the substrate and spaced apart from the first electrode in a first direction crossing a direction perpendicular to the substrate; and
  an active layer covering the first electrode and the second electrode; and
a light-emitting element comprising:
  a pixel electrode arranged on the substrate;
  a counter electrode arranged on the pixel electrode;
  a light-emitting layer arranged between the pixel electrode and the counter electrode;
  a first common layer arranged between the pixel electrode and the light-emitting layer; and
  a second common layer arranged between the light-emitting layer and the counter electrode.

18. The electronic device of claim 17, wherein
the substrate comprises a light-emitting area and a sensing area,
the light-emitting element is arranged to correspond to the light-emitting area, and
the organic photodetector is arranged to correspond to the sensing area.

19. The electronic device of claim 18, wherein the pixel electrode and the light-emitting layer are arranged to correspond to the light-emitting area.

20. The electronic device of claim 18, wherein the first common layer and the second common layer are arranged entirely in the light-emitting area and the sensing area.

* * * * *